United States Patent
Enkisch

(10) Patent No.: US 11,073,765 B2
(45) Date of Patent: Jul. 27, 2021

(54) METHOD FOR PRODUCING A REFLECTIVE OPTICAL ELEMENT AND REFLECTIVE OPTICAL ELEMENT

(71) Applicant: Carl Zeiss SMT GmbH, Oberkochen (DE)

(72) Inventor: Hartmut Enkisch, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 441 days.

(21) Appl. No.: 16/053,130

(22) Filed: Aug. 2, 2018

(65) Prior Publication Data
US 2018/0341179 A1  Nov. 29, 2018

Related U.S. Application Data

(63) Continuation of application No. PCT/EP2017/051961, filed on Jan. 30, 2017.

(30) Foreign Application Priority Data

Feb. 2, 2016 (DE) .......................... 102016201564.8

(51) Int. Cl.
G03F 7/20 (2006.01)
G02B 5/08 (2006.01)
G02B 5/09 (2006.01)

(52) U.S. Cl.
CPC ........... G03F 7/702 (2013.01); G02B 5/0816 (2013.01); G02B 5/0891 (2013.01); G02B 5/09 (2013.01);
(Continued)

(58) Field of Classification Search
CPC .... G03F 7/702; G03F 7/7015; G03F 7/70075; G03F 7/70116; G02B 5/0816; G02B 5/0891; G02B 5/09
See application file for complete search history.

(56) References Cited

U.S. PATENT DOCUMENTS

2003/0222225 A1* 12/2003 Shiraishi ................ G21K 1/062
250/492.2
2008/0165415 A1* 7/2008 Chan .................... G02B 5/0891
359/351
(Continued)

FOREIGN PATENT DOCUMENTS

DE  10 2004 060 184 A1  7/2006
DE  10 2011 005 144 A1  9/2011
(Continued)

OTHER PUBLICATIONS

Translation of DE-102012213937-A1 (Year: 2013).*
(Continued)

*Primary Examiner* — Darryl J Collins
*Assistant Examiner* — Matthew Y Lee
(74) *Attorney, Agent, or Firm* — Edell, Shapiro & Finnan, LLC

(57) ABSTRACT

For increasing reflectivity a reflective optical element for the extreme ultraviolet wavelength range consists of at least two upper units, in which each upper unit (B1-B5) has a plurality of lower units, for example reflective optical elements in the form of mirror arrays. A method for producing the reflective optical element includes: determination of incidence angles and incidence angle bandwidths occurring during operation above the surface of each upper unit (B1-B5); and application of a reflective coating to each upper unit (B1-B5), adapted to the incidence angles and incidence angle bandwidths respectively determined above the surface of each upper unit. This is particularly suitable for producing reflective optical elements embodied as field facet mirrors, particularly in the form of microelectromechanical mirror arrays, for an EUV lithography device.

14 Claims, 17 Drawing Sheets

(52) U.S. Cl.
CPC ........ *G03F 7/7015* (2013.01); *G03F 7/70075* (2013.01); *G03F 7/70116* (2013.01)

(56) References Cited

U.S. PATENT DOCUMENTS

| | | | |
|---|---|---|---|
| 2011/0228245 | A1 | 9/2011 | Mann et al. |
| 2015/0219977 | A1 | 8/2015 | Greinert et al. |
| 2015/0219997 | A1 | 8/2015 | Yoshio |
| 2016/0048083 | A1 | 2/2016 | Endres et al. |

FOREIGN PATENT DOCUMENTS

| | | | | |
|---|---|---|---|---|
| DE | 10 2010 041 502 | A1 | 3/2012 | |
| DE | 10 2011 080 636 | A1 | 3/2012 | |
| DE | 10 2011 077 234 | A1 | 12/2012 | |
| DE | 10 2011 080 052 | A1 | 1/2013 | |
| DE | 10 2012 213 937 | A1 | 5/2013 | |
| DE | 102012213937 | A1 * | 5/2013 | ......... G03F 7/70075 |
| DE | 10 2012 205 615 | A1 | 10/2013 | |
| DE | 10 2012 212 757 | A1 | 1/2014 | |
| DE | 10 2013 203 364 | A1 | 9/2014 | |
| EP | 2319951 | A1 | 5/2011 | |
| WO | 2013/014182 | A1 | 1/2013 | |
| WO | 2014012660 | A2 | 1/2014 | |

OTHER PUBLICATIONS

International Search Report and Written Opinion in counterpart International Application No. PCT/EP2017/051961, dated Jun. 4, 2017, 6 pages.
Office Action in corresponding German Application 102016201564.8, dated Sep. 29, 2018., along with English Translation.
International Preliminary Report on Patentability, PCT/EP2017/051961, date of issuance of this report Aug. 7, 2018, 8 pages.

* cited by examiner

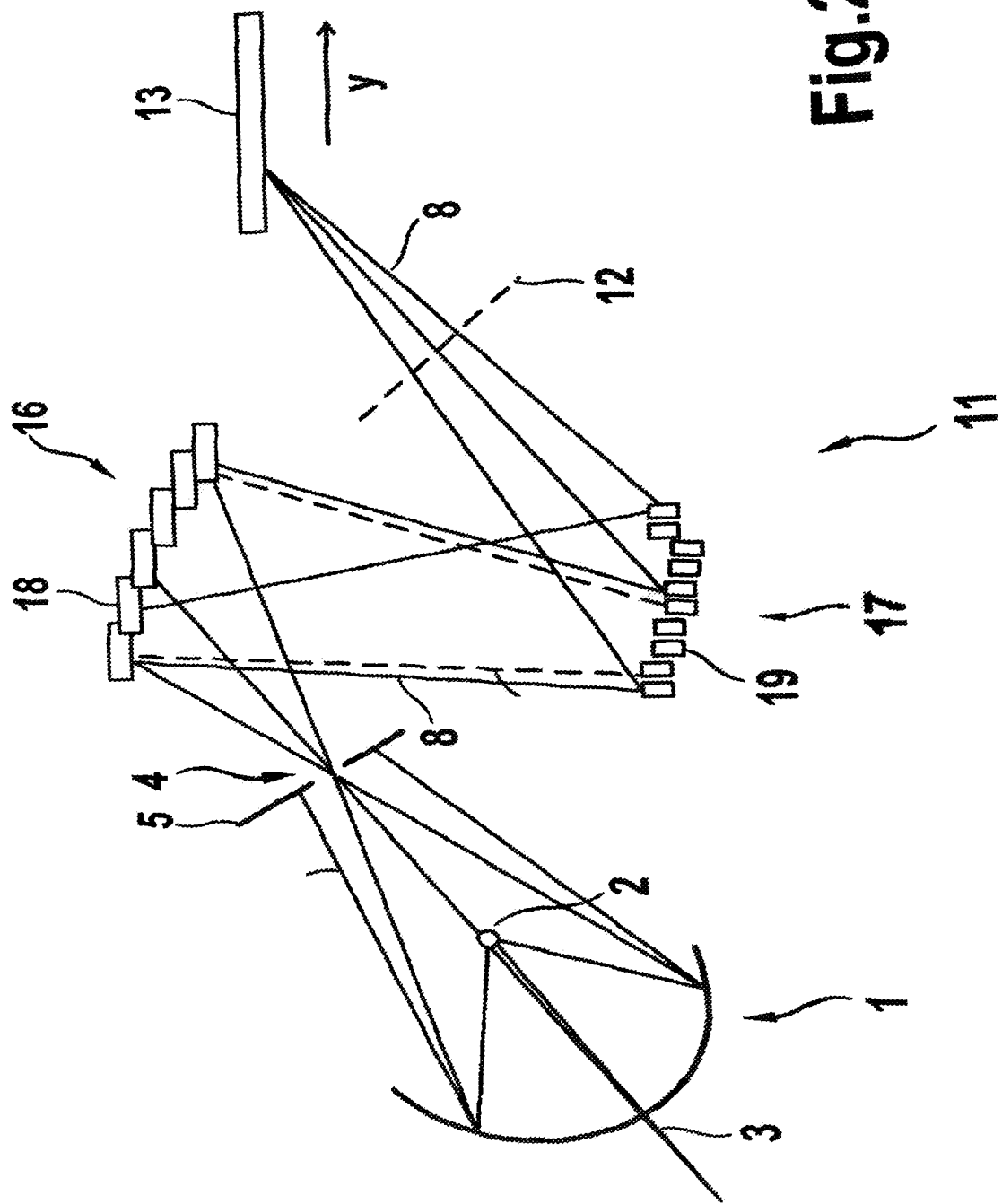

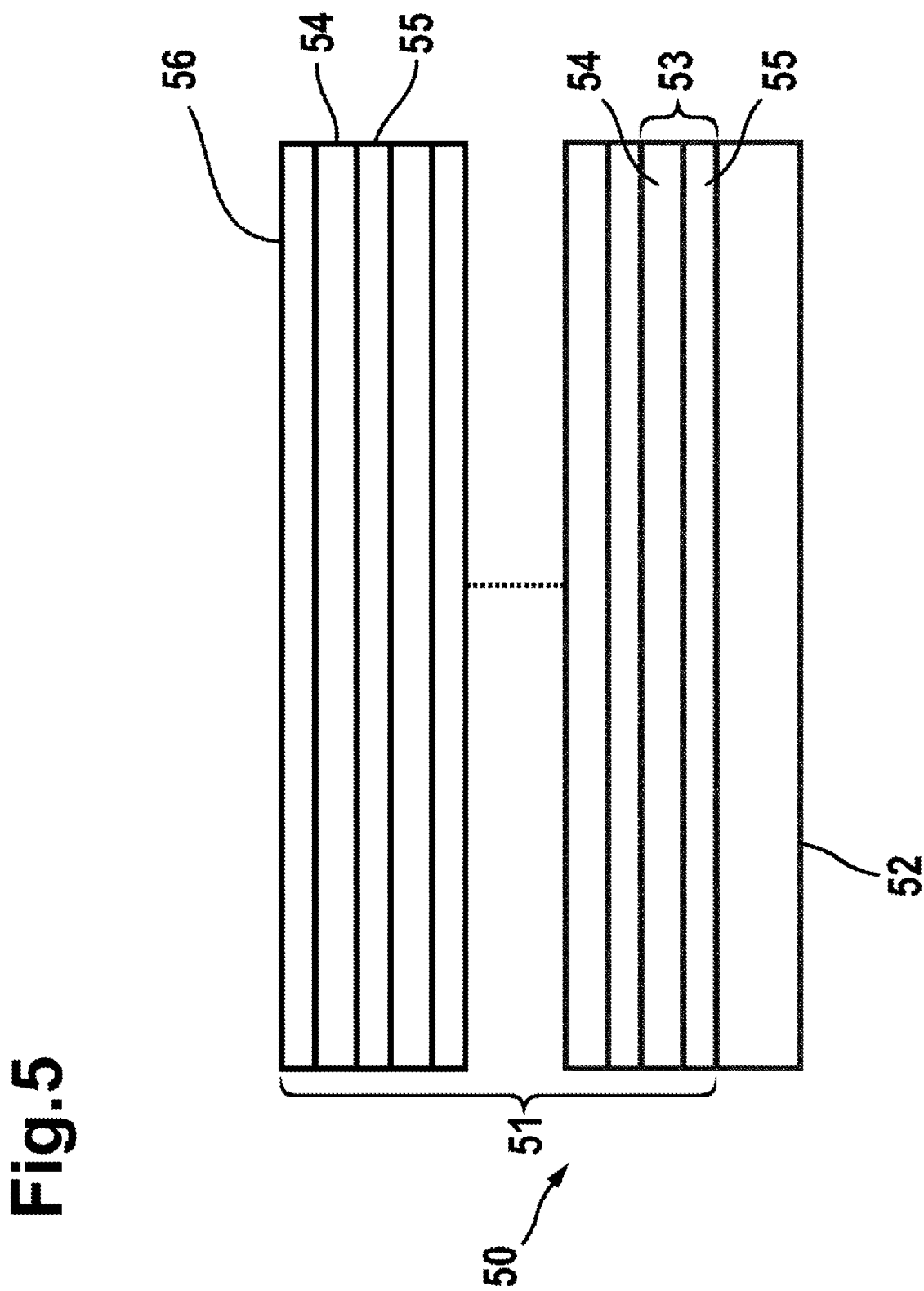

Fig.8

METHOD FOR PRODUCING A REFLECTIVE OPTICAL ELEMENT AND REFLECTIVE OPTICAL ELEMENT

CROSS REFERENCE TO RELATED APPLICATIONS

This is a Continuation of International Application PCT/EP2017/051961, which has an international filing date of Jan. 30, 2017, and which claims the priority of the German Patent Application No. 102016201564.8, filed Feb. 2, 2016. The disclosures of both applications are incorporated in their respective entireties into the present application by reference.

FIELD OF THE INVENTION

The present invention relates to a method for producing a reflective optical element, composed of at least two main units, for the extreme ultraviolet wavelength range (approximately 1 nm to 20 nm, hereinafter EUV), wherein each main unit has a multiplicity of sub-units, and to a reflective optical element for the extreme ultraviolet wavelength range, composed of at least two main units, wherein each main unit has a multiplicity of sub-units. It furthermore relates to an optical element and to an EUV lithography apparatus having such a reflective optical element.

BACKGROUND

DE 10 2012 213 937 A1 discloses a mirror array for use in the illumination system of an EUV lithography apparatus. This mirror array is composed of a plurality of sub-arrays, which for their part have a multiplicity of individual mirrors. In order to allow simplified maintenance of the illumination optical unit, provision is made for all individual mirrors of all sub-arrays to be provided with a reflective coating, which is broad-banded such that it covers all angles of incidence that may occur during operation of the mirror array at the various sub-arrays. In particular, this is a micro-mirror array, which is embodied in the form of microelectromechanical systems.

SUMMARY

It is an object of the present invention to improve mirror arrays in particular for EUV lithography such that their reflectivity is increased.

In a first aspect, this object is achieved by a method for producing a reflective optical element, which is composed of at least two main units, for the extreme ultraviolet wavelength range, wherein each main unit has a multiplicity of sub-units, having the steps of:
  determining angles of incidence and angle of incidence bandwidths occurring over the surface of each main unit during operation;
  applying a reflective coating on each main unit, which is adapted to the angles of incidence and angle of incidence bandwidths which are respectively determined over the surface thereof.

This production method has the advantage that by adapting the reflective coating on each main unit to the angles of incidence and angle of incidence bandwidths occurring there during operation, the reflectivity can be increased. Meanwhile, the outlay during the production of the reflective optical element and later also the maintenance thereof remains relatively limited, because the optimization to the angle of incidence bandwidths can in particular be limited to the main units. In particular in EUV lithography apparatuses, a plurality of reflective optical elements are arranged in series. The total reflectivity within EUV lithography apparatuses is therefore not very high, and any reflectivity yields are an advantage.

In preferred embodiments, the maximum bandwidth of the angles of incidence is determined for each main unit, and a multilayer system, having a layer sequence and/or layer thicknesses that is/are adapted to the overall largest determined maximum bandwidth, is applied onto all main units as a reflective coating. This procedure has the advantage that the outlay during production of the main units can be kept low.

The multilayer systems in this embodiment, and in the following embodiments, are preferably multilayer systems based on layers, arranged in alternation on a substrate, of a material having a lower real part of the refractive index in the extreme ultraviolet wavelength range and of a material having a higher real part of the refractive index in the extreme ultraviolet wavelength range, in particular at the operating wavelength at which the lithographic process is performed. The layers, which are arranged in alternation, can be combined to periods of a specific length. Said multilayer systems are particularly suitable for the extreme ultraviolet wavelength range and can be formed, as is known, with great flexibility due to the selection of the materials, the layer sequence, and the thickness ratios for desired average angles of incidence and angle of incidence bandwidths at a selected wavelength. In a specific layer sequence, it is in particular possible by changing the layer thicknesses by a constant factor for the angle of incidence at which the highest reflectivity at a selected wavelength is achieved to be shifted.

In a further preferred embodiment, the maximum bandwidth of the angles of incidence is determined for each main unit, and then the main units are divided into broadband classes, and a multilayer system, having a layer sequence and/or layer thicknesses that is/are adapted to the maximum bandwidth that is determined for the respective bandwidth class, is applied onto each main unit as a reflective coating. A higher reflectivity of the reflective optical element can be achieved hereby. This procedure is particularly preferred in the case of more than two main units. A basic multilayer system can be prescribed for each class. It is possible for example to exert influence on the angle bandwidth of a multilayer system by way of layer sequences that have aperiodicities or by way of layer thickness gradients perpendicular to the substrate. Advantageously, the respective basic multilayer system is designed for the bandwidth of the main unit having the greatest angle of incidence bandwidth within a class.

Each main unit is particularly preferably divided into surface units, and for each main unit the angles of incidence occurring during operation over all the surface units thereof are determined. Next, a desired period length of a multilayer system is ascertained in dependence on the desired angles of incidence, and the variation of the desired period length over the surface units for each main unit is approximated by an nth-degree polynomial, with n being a non-negative integer. Subsequently, the corresponding multilayer system is applied to each main unit as a reflective coating.

In the simplest variants, for each main unit a constant desired period length is ascertained, which corresponds to a zero-degree polynomial. Approaches for ascertaining period lengths, which are desired in dependence on specific angles of incidence occurring during operation are well-known. For example, DE 2013 203 364 A1 discloses different methods for ascertaining a desired period length from a maximum and a minimum angle of incidence. It is possible in this way, among others, in principle to produce the reflective coatings for all main units in a single coating batch, wherein different layer thicknesses can be set for the individual main unit to be coated by way of a period length profile via the coating holder in the coating system.

In further variants, the profile of the desired period lengths over the respective main unit can be approximated by first-degree polynomials, that is to say linear functions. Main units, which have been designed in this way can also be combined to batches and be coated in one process. The higher the degree of the polynomial with which the profile of the desired period length is approximated, the lower is the deviation of the applied period length profile from the ideal period length profile. Thereby, the reflectivity of the main units and of the reflective optical element which is composed thereof increases. A sufficient thickness control over the surface can be achieved during coating for example by the use of honeycomb masks. In the case of more complex thickness profiles, it is also possible to use a coating method as described in DE 10 2012 205 615 A1, in which layer-forming particles are ionized and applied onto the surface to be coated in a targeted fashion by way of electrical and/or magnetic fields. Alternatively or additionally, the sub-units can be oriented differently with respect to the coating source, in order to influence the applied layer thicknesses in this way as well. With this embodiment, reflective optical elements can be produced, which have a particularly high total reflectivity.

It should be pointed out that the profile of the desired period length can be approximated one-dimensionally in one direction in the surface or two-dimensionally over the surface of the main units.

It is particularly advantageous if the surface units correspond to the sub-units of the main units. To this end, a surface unit can be identical to the surface of a sub-unit. Depending on the number of sub-units, it may also make sense for a plurality of neighbouring sub-units to be combined to surface units, in particular if the distribution of the angles of incidence or the angle of incidence bandwidth over these sub-units is comparable.

Advantageously, a reflective coating is applied onto the main units by locating the main units on a coating holder, which rotates about an axis, wherein regions of constant layer thicknesses are arranged concentrically around the axis. Depending on the required layer thicknesses or period lengths, the main units can be arranged at different distances from the axis of rotation of the coating holder in order to be able to coat main units with reflective coatings, which are adapted differently to angles of incidence and angle of incidence bandwidth occurring during operation, in common batches.

In a further aspect, the object is achieved by a reflective optical element for the extreme ultraviolet wavelength range, composed of at least two main units, wherein each main unit has a multiplicity of sub-units, in which each main unit has a reflective coating that is adapted to the angles of incidence and angle of incidence bandwidths respectively occurring over the surface of the main unit during operation. Such composed reflective optical elements have a higher reflectivity than those known from the prior art, yet are producible with an outlay, which is not too great.

The reflective coatings are preferably embodied as multilayer systems, having layer thicknesses and/or a layer sequence which is/are adapted to the angles of incidence and angle of incidence bandwidths respectively occurring over the surface of the main unit during operation. In particular, each main unit of the reflective optical element has a multilayer system, which is adapted to the angles of incidence occurring during operation specifically in this main unit. With respect to the angle of incidence bandwidth, all main units, or in each case at least two main units, can have multilayer systems which are adapted to the same angle of incidence bandwidth. In particular, the multilayer systems can have aperiodicities or thickness gradients perpendicular to the multilayer system surface.

In preferred embodiments, the reflective coatings are embodied as multilayer systems, the layer thicknesses of which vary with a function that corresponds in each case to an nth-degree polynomial, with n being a non-negative integer. This can be a one-dimensional or a two-dimensional polynomial over the surface of the multilayer system of zeroth, first, second, third, fourth or any higher degree.

Preferably, each sub-unit is implemented as an individually actuable mirror. With very particular preference, each main unit is implemented as a microelectronic system of micro-mirrors. Consequently, the reflective optical element can be used particularly well in optical systems or in EUV lithography apparatuses in places where elements with a relatively great surface area are required, which must be aligned differently and precisely at the same time over the entire surface.

The reflective optical element is preferably implemented as a field facet mirror. In particular, reflective optical elements based on microelectromechanical systems of micro-mirrors, such as mirror arrays, are suitable to be used as field facet mirrors. The tilt of the individual actuable micro-mirrors is set during operation such that both the tilt of a field facet and the curvature thereof are emulated. Here, each main unit contributes, for example as a sub-array, to a plurality of field facets, and each field facet is made up of sections of a plurality of main units. Each field facet has an individual average angle of incidence and an individual bandwidth of angles of incidence. The reflective optical element described here is particularly suitable for offering good reflectivity by taking into account the distribution of the angles of incidence over the field facet mirror. The reflective optical element introduced here can also be implemented as a pupil facet mirror.

In further aspects, the object is achieved by an optical system, in particular for EUV lithography, or by an EUV lithography apparatus having a reflective optical element as described above.

BRIEF DESCRIPTION OF THE DRAWINGS

The present invention will be explained in more detail with reference to preferred exemplary embodiments. In the Figures:

FIG. 2 shows a schematic view of an embodiment of an illumination system,

FIG. 5 shows a schematic of a multilayer system;

FIG. 8 shows the reflective coating of a first embodiment of a reflective optical element according to the invention with five main units;

DETAILED DESCRIPTION

Figure 1:
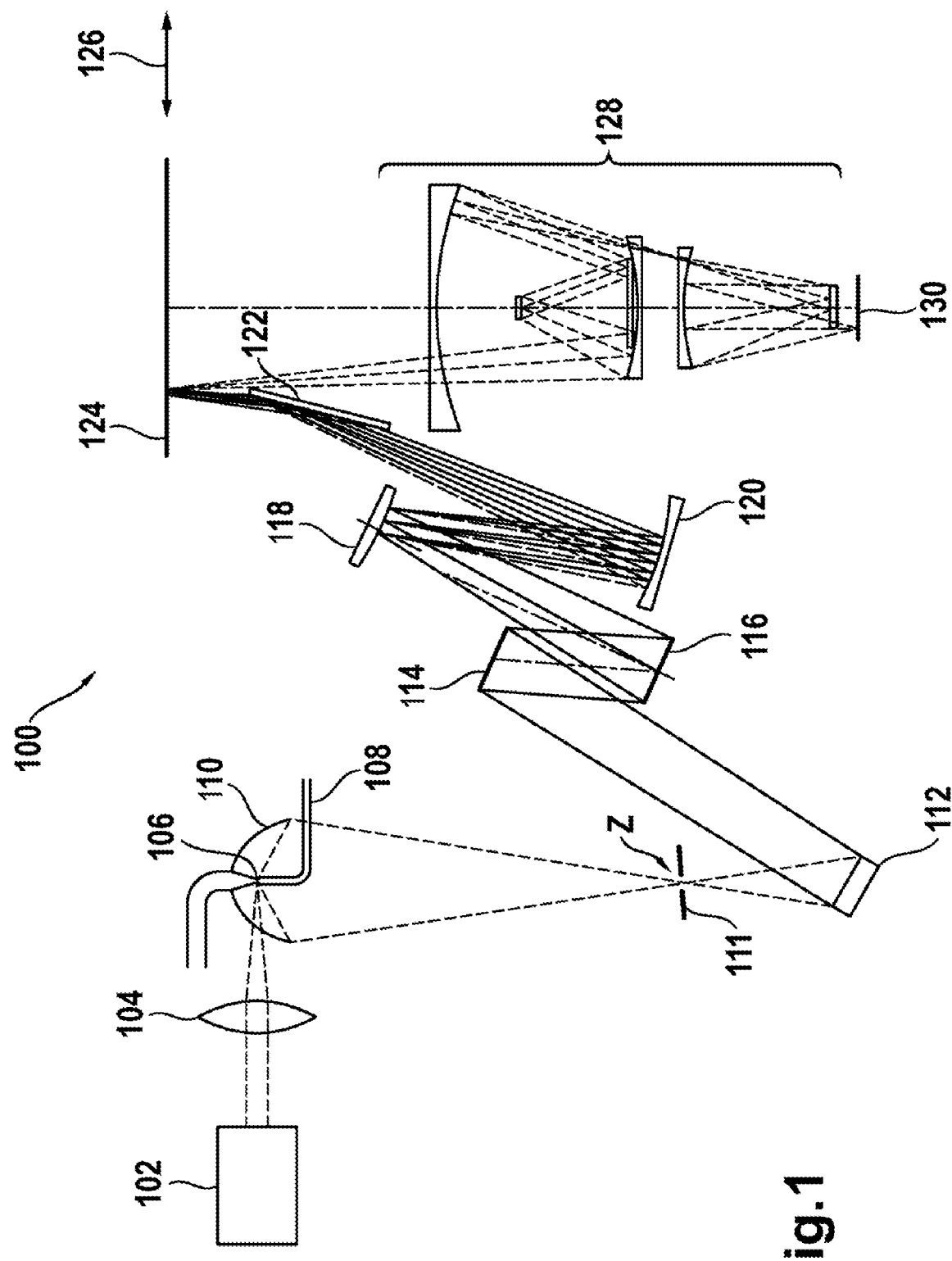
FIG. 1 shows a schematic view of an embodiment of an EUV lithography apparatus.

FIG. 1 shows a schematic view of a projection exposure apparatus 100 for producing, for example, microelectronic devices, which is operated in a scan mode along a scan direction 126 at an operating wavelength in the EUV range and which can have one or more optical elements with additional coating. The projection exposure apparatus 100 shown in FIG. 1 has a point-type plasma radiation source. The radiation from the laser source 102 is directed, via a condenser 104, onto suitable material, which is introduced via the feed 108 and excited to a plasma 106. The radiation emitted by the plasma 106 is imaged by the collector mirror 110 onto the intermediate focus Z. Appropriate stops 111 at the intermediate focus Z ensure that no undesired stray radiation is incident on the subsequent mirrors 112, 114, 116, 118, 120 of the illumination system of the projection exposure apparatus 100. The plane mirror 122 serves for folding the system, so as to offer installation space for mechanical and electronic components in the object plane in which the mount for the reticle 124 is arranged. The mirror 112 in the present example is followed in the illumination system by a field facet mirror 114 and a pupil facet mirror 116. The field facet mirror 114 serves to project a multiplicity of images of the radiation source of the projection exposure apparatus into a pupil plane, in which a second facet mirror is arranged, which serves as the pupil facet mirror 116 and superposes the images of the facets of the field facet mirror 114 in the object plane so as to make possible the most homogeneous lighting possible. The mirrors 118 and 120, which are arranged downstream of the facet mirrors 114, 116, substantially serve to form the field in the object plane. Arranged in the object plane is a structured reticle 124, the structure of which is imaged onto the object 130 to be exposed, for example a wafer, using a projection lens 128, which has six mirrors in the present example. The reticle 124 in the projection exposure apparatus 100, which is designed here as a scanning system, is displaceable in the marked direction 126 and is successively lit in sections in order to correspondingly project the respective structures of the reticle 124 onto, for example, a wafer 130 using the projection lens.

FIG. 2 shows a radiation source in connection with an illumination system 11, which is part of a projection exposure apparatus for EUV lithography. A collector 1 is arranged around a light source that is formed by a plasma droplet 2, which is excited by an infrared laser 3. In order to obtain wavelengths in the region around, for example, 13.5 nm in the EUV wavelength range, e.g. tin can be excited to a plasma using a carbon dioxide laser operating at a wavelength of 10.6 µm. Instead of a carbon dioxide laser, it is also possible to use solid-state lasers, for example. The collector 1 is followed, downstream of the stop 5 at the intermediate focus 4, by a field facet mirror 16 having individual facets 18 and a pupil facet mirror 17 having individual facets 19. Before the rays 8 are incident on the reticle 13, which has the structure that is to be projected onto a wafer and which is to be scanned in the y-direction, they are deflected by a folding mirror 12. The folding mirror 12 has less of an optical function and rather serves to optimize the space requirement of the illumination system 11.

It should be noted that a wide variety of radiation sources can be used in UV or EUV lithography, including plasma sources which may be based on laser excitation (LPP sources) or gas discharge (DPP sources), synchrotron radiation sources and free electron lasers (FEL). Furthermore, the collectors can have any desired design, including as a Wolter collector or as an ellipsoidal collector, preferably adapted to the radiation source that is used in each case.

The facet mirrors, in particular the field facet mirror, in the present example are embodied as a reflective optical element for the extreme ultraviolet wavelength range, composed of at least two main units, wherein each main unit has a multiplicity of sub-units, and wherein each main unit has a reflective coating that is adapted to the angles of incidence and angle of incidence bandwidths respectively occurring over the surface of the main unit during operation. The field facet mirror was produced by first determining the angles of incidence and angle of incidence bandwidths occurring over the surface of each main unit during operation and subsequently applying a reflective coating on each main unit, which is adapted to the angles of incidence and angle of incidence bandwidths which are respectively determined over the surface thereof.

Figure 4:
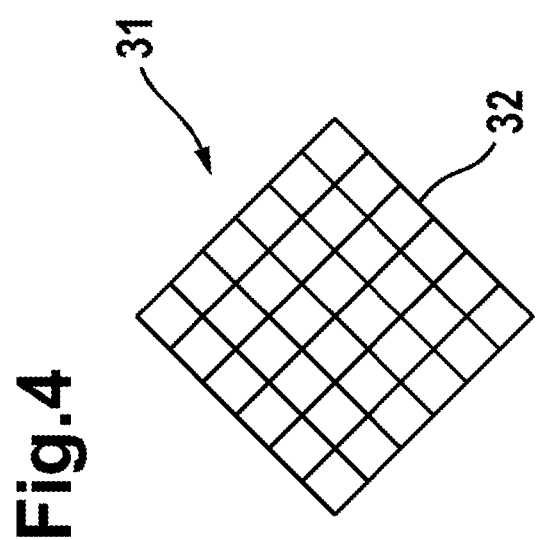
FIG. 4 shows a schematic view of a main unit.
Figure 3:
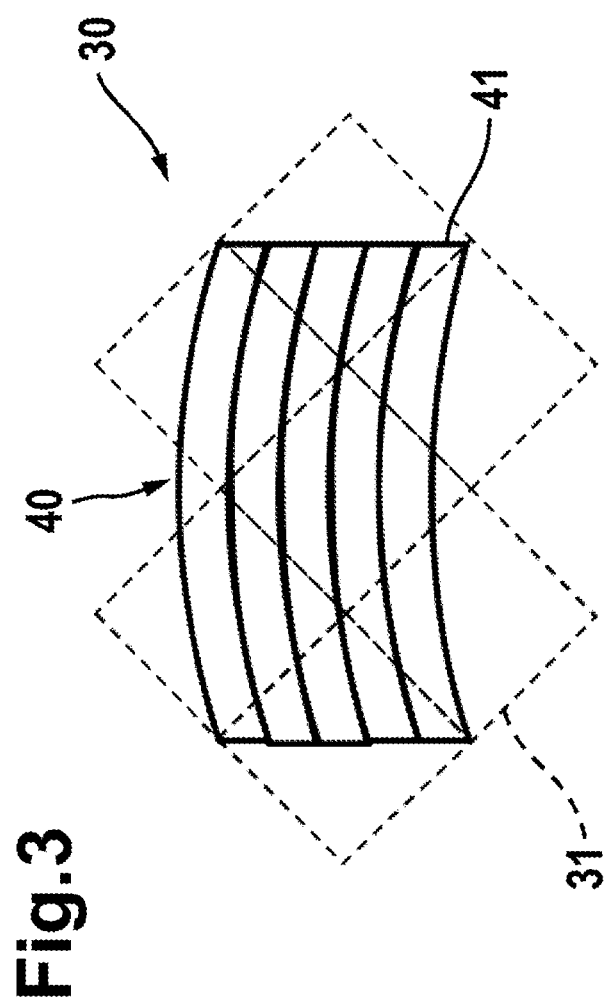
FIG. 3 shows a schematic view of an embodiment of a reflective optical element with seven main units.

FIG. 3 shows a reflective optical element 30 according to the invention having seven main units 31, which is designed to replace a conventional field facet mirror 40 having seven field facets 41, which is not implemented as a micro-mirror array. As is shown by way of example in FIG. 4, one main unit 31 has a multiplicity of sub-units 32, which, in the present example, are implemented in the form of individually actuable micro-mirrors. Together they form a microelectromechanical system.

As shown in FIG. 3, each field facet 41 is formed by a plurality of main units 31, and each main unit 31 makes a contribution to more than one field facet 41. Each field facet 41 has an individual angle of incidence and an individual angle of incidence bandwidth owing to the various positions and curvature of the former. Consequently, different angles of incidence with different angle of incidence bandwidths are also incident at different locations of each main unit 31.

FIG. 5 schematically shows the structure of a sub-unit 50 of the reflective optical element. The illustrated example shows a micro-mirror element based on a multilayer system 51, which has been applied on a substrate 52. Materials having a low coefficient of thermal expansion are preferably chosen as substrate materials. The multilayer system 51 substantially comprises alternately applied layers of a material with a higher real part of the refractive index at the operating wavelength at which for example the lithographic exposure is carried out (also called spacer 55) and of a material with a lower real part of the refractive index at the operating wavelength (also called absorber 54), wherein in the example shown here, an absorber-spacer pair forms a stack 53 which corresponds to a period in the case of periodic multilayer systems. In certain respects a crystal is thereby simulated whose lattice planes correspond to the absorber layers at which Bragg reflection takes place. The thicknesses of the individual layers 54, 55 and also of the repeating stacks 53 can be constant over the entire multilayer system 51 or vary, depending on what spectral or angle-dependent reflection profile is intended to be achieved. The reflection profile can also be influenced in a targeted manner by the basic structure composed of absorber 54 and spacer 55 being supplemented by further more and less absorbent materials in order to increase the possible maximum reflectivity at the respective operating wavelength. To this end, absorber and/or spacer materials can be interchanged in some stacks, or additional layers of other materials may be provided. The absorber and spacer materials can have constant or varying thicknesses over all the stacks in order to optimize the reflectivity. Furthermore, it is also possible to provide in individual or all stacks additional layers for example as diffusion barriers between spacer and absorber layers 55, 54 to increase the thermal stability. The first layer adjoining the substrate 52 can be an absorber layer, a spacer layer or an additional layer. To protect the reflective coating against external influences, it is possible for a protective layer 56, which can also include more than one layer, to be provided as a termination with respect to the vacuum. Preferred materials for the EUV wavelength range include molybdenum as the absorber material and silicon as the spacer material.

Broadband reflective coatings can be produced in typical ways by way of multilayer systems, which are, for example, periodic having a low period number, have two or more periodic sub-systems with different period lengths, or are completely aperiodic. In addition, they can have a layer thickness gradient in the direction perpendicular to the substrate. The angle of incidence with the highest reflectivity for a specific multilayer system can be shifted, for example, by varying the period length for said multilayer system. Various approaches as to how a desired period length for the multilayer system of a reflective optical element is determined as reflective coating for example from an angle of incidence onto said reflective optical element which is maximum during operation and one which is minimum during operation is described, for example, in DE 2013 203 364 A1. A disadvantage when selecting an identical reflective coating for all main units is the relatively low total reflectivity.

Figure 6:
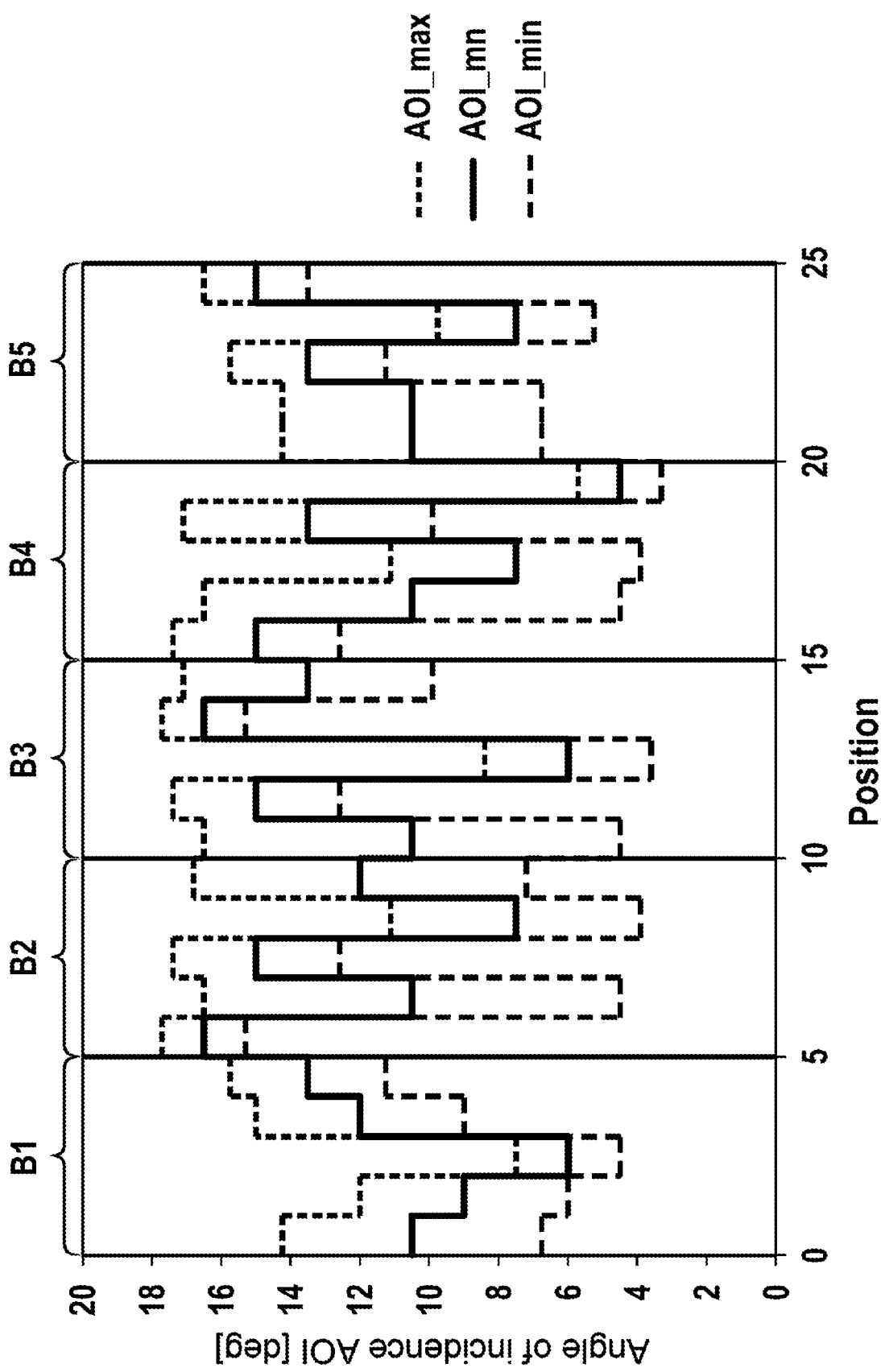
FIG. 6 shows the distribution of angles of incidence over the surface of a reflective optical element having five main units.

FIG. 6 shows, by way of example, the angles of incidence over the surface of a reflective optical element, which is embodied as a micro-mirror array. By way of example, it has five main units B1 to B5, which are embodied as sub-arrays and have a multiplicity of actuable micro-mirrors as subunits. In the present example, the reflective optical element serves as a facet mirror, in particular as a field facet mirror, wherein each main unit in section-wise fashion corresponds to one of five conventional field facets. In these sections, during operation in, for example, the illumination system of an EUV lithography apparatus, different angle of incidence distributions are incident on each surface unit of a main unit B1 to B5, which can respectively be assigned to a field facet. Of these are plotted for each main unit B1 to B2 in FIG. 6, in degrees over various positions which are assigned to in each case one surface unit or one field facet, the maximum angle of incidence as AOI_max (short dashes), the average (mean) angle of incidence as AOI_mn (solid line), and the minimum angle of incidence as AOI_min (long dashes). The respective angle of incidence bandwidth can be ascertained via the difference between minimum and maximum angle of incidence.

In the example shown in FIG. 6, the maximum angles of incidence in the first main unit B1 vary between approx. 7.5° and approx. 15.5°, the minimum angles of incidence between approx. 4.5° and approx. 11.5°, and the angle of incidence bandwidth between approx. 2° and approx. 7°. In the second main unit B2, the maximum angles of incidence vary between approx. 11° and approx. 18°, the minimum angles of incidence between approx. 4° and approx. 12.5°, and the angle of incidence bandwidth between approx. 2° and approx. 8°. In the third main unit B3, the maximum angles of incidence vary between approx. 8.5° and approx. 18°, the minimum angles of incidence between approx. 3.5° and approx. 15.5°, and the angle of incidence bandwidth between approx. 2° and approx. 7.5°. In the fourth main unit B4, the maximum angles of incidence vary between approx. 5.5° and approx. 17.5°, the minimum angles of incidence between approx. 3.5° and approx. 13°, and the angle of incidence bandwidth between approx. 2° and approx. 8°. In the fifth main unit B5, the maximum angles of incidence vary between approx. 9.5° and approx. 16.5°, the minimum angles of incidence between approx. 5° and approx. 13°, and the angle of incidence bandwidth between approx. 2° and approx. 5°.

Figure 7:
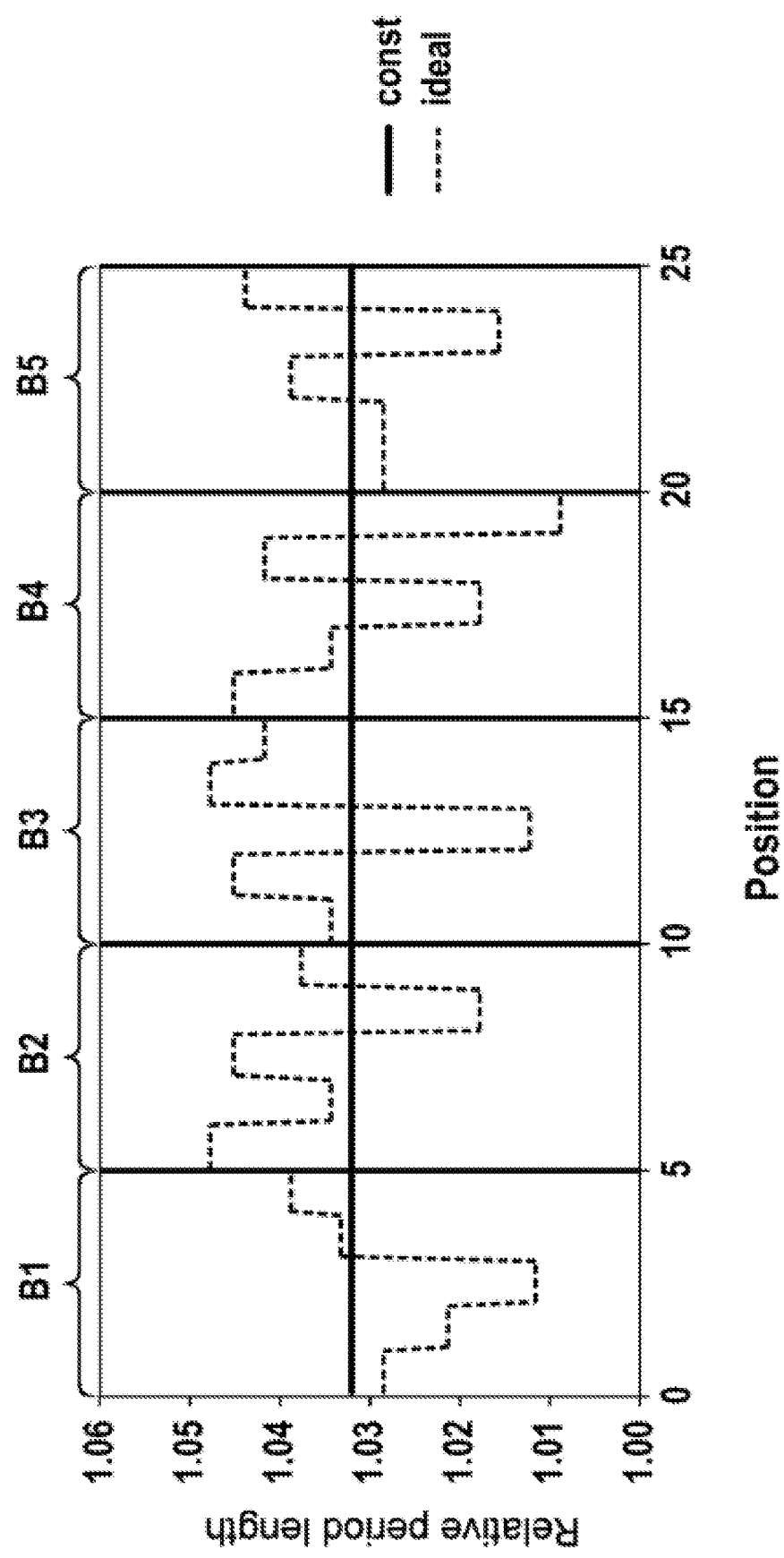
FIG. 7 shows the reflective coating of a conventional reflective optical element with five main units.

FIG. 7 shows a reflective optical element, composed of five main units B1 to B5, according to the prior art, which was mentioned in the introductory part. On all five main units B1 to B5, it has an identical reflective coating, which is designated with "const." Additionally shown is the ideal desired period length over the individual positions, which is designated with "ideal." The reflective coating in the present example is a periodic multilayer system. To optimize the reflectivity, the period length was extended globally over all main units B1 to B5 by a little more than 3%.

To increase the total reflectivity of the reflective optical element, in particular when used as a field facet mirror in the illumination system of an EUV lithography apparatus, it is proposed to take account of the angles of incidence and the angle of incidence distribution occurring during operation in the reflective coating of the main units separately for each main unit. The reflective coatings are advantageously embodied as multilayer systems, having layer thicknesses and/or a layer sequence which is/are adapted to the angles of incidence and angle of incidence bandwidths respectively occurring over the surface of the main unit during operation. Advantage is taken here in particular of the fact that the angle of incidence with the highest reflectivity at a specific wavelength can be changed by varying the period length, especially when using multilayer systems as the basis of the reflective coating which is suitable for a specific angle of incidence bandwidth.

In a first exemplary embodiment, the reflective coating of the reflective optical element is embodied as a multilayer system of a specific layer sequence, which is based on a broadbandedness that is desired for all main units. In this embodiment, the desired broadbandedness preferably takes its cue from the main unit having the greatest occurring angle of incidence bandwidth. The desired period length is optimized for each main unit individually in dependence on the angles of incidence occurring during operation. In this way, the variation of the desired period length over the surface units for each main unit is approximated by a zero-degree polynomial, and a corresponding reflective coating is applied.

Figure 8:
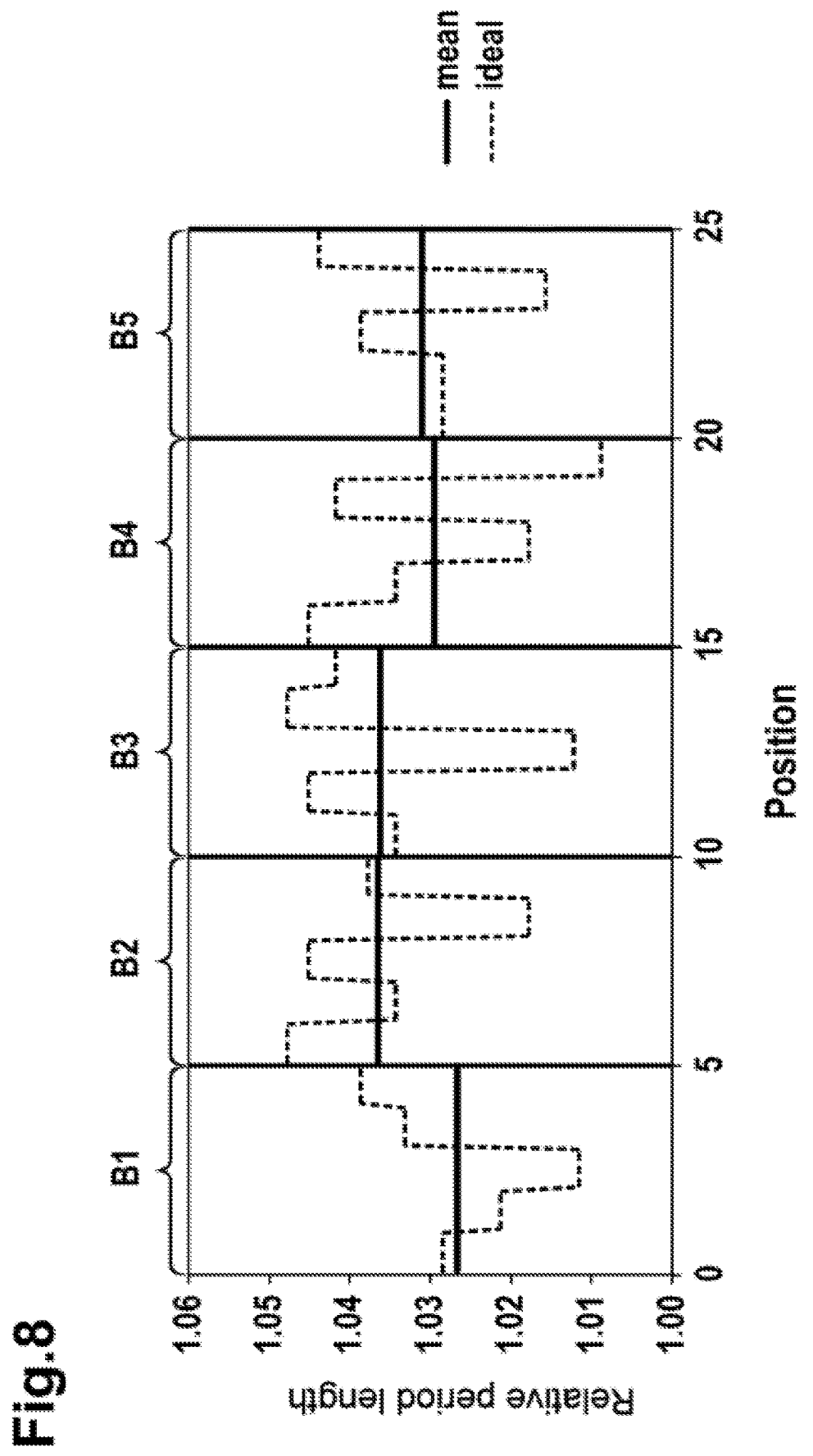

FIG. 8 shows such an embodiment which, analogously to the illustration in FIG. 7, likewise has five main units B1 to B5 and is designed for use as a field facet mirror with the angles of incidence shown in FIG. 6. For each main unit B1 to B5, the desired period length has been determined for each surface unit in dependence on the angles of incidence occurring there. In accordance with the angles of incidence and angle of incidence distribution ascertained for each main unit B1 to B5, a calculation was performed as to the factor by which the desired period length of the multilayer system, on which the reflective coating is based, with desired broadbandedness for each main unit should be modified. In the example shown in FIG. 8, the factor varies between just under 1.03 to almost 1.04. The period length for the respective main unit is drawn as a thick solid line, which is designated with "mean."

Since the reflective coating for all main units B1 to B5 is based on the same multilayer system with desired broadbandedness, and consequently both the materials, the sequence thereof in the form of layers, and the layer thickness ratios correspond for all main units, all five main units can be coated in one batch, wherein a different layer thickness distribution is set via the coating holder. Depending on which main unit is intended to have which period length, they are arranged on the coating holder appropriately for the coating. For example, a coating holder, which rotates about an axis can be used herefor. Regions of constant layer thicknesses are situated on concentric circles around the axis of rotation.

Figure 9:
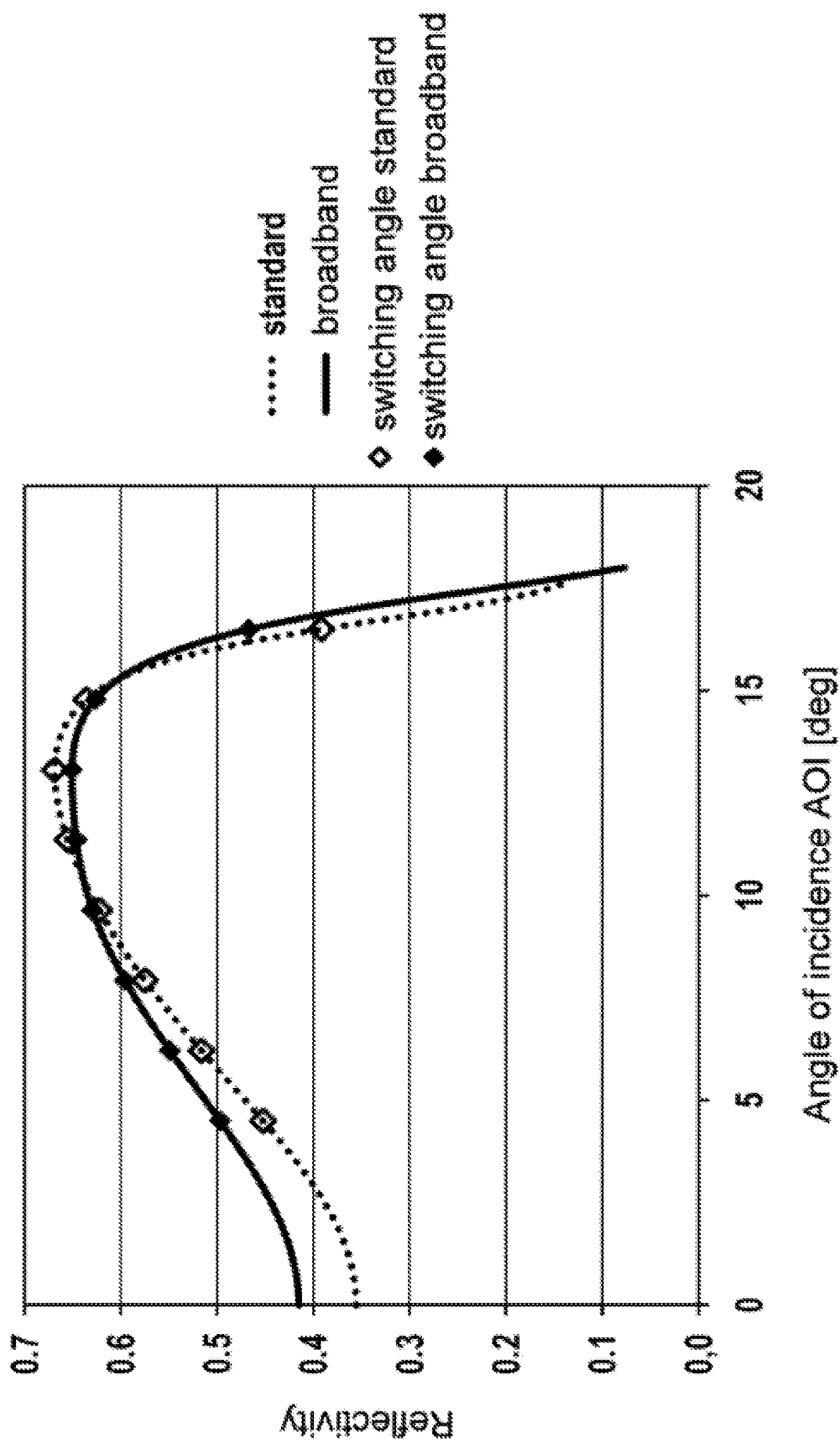
FIG. 9 shows the reflectivity as a function of angles of incidence for two different multilayer systems.

Depending on the ascertained angle of incidence bandwidth, the main units can be divided into different classes. In the example illustrated here, two classes can be used. The main units B1 and B5, which have an angle of incidence bandwidth of approx. 12°, are placed in the first class. The main units B2, B3 and B4, which have an angle of incidence bandwidth of approx. 14°, are placed in the second class (see FIG. 6). The basic multilayer systems are selected differently for both classes, adapted to the required bandwidth. FIG. 9 shows the reflectivity in dependence on the angle of incidence at a wavelength of 13.5 nm for both basic multilayer systems in the form of a dashed line, designated with "standard," for the first class, and as a solid line, designated with "broadband," for the second class. The two classes can be coated in two different batches. It is also possible to obtain coatings with different broadbandedness on different radii of the coating holder in the case of a variation of a rotation-symmetrical thickness profile of the individual layers such that a thickness gradient perpendicular to the substrate is obtained. Additionally, the respectively desired period length is also taken into account, as explained, in the case of the coating of each individual main unit.

Figure 10:
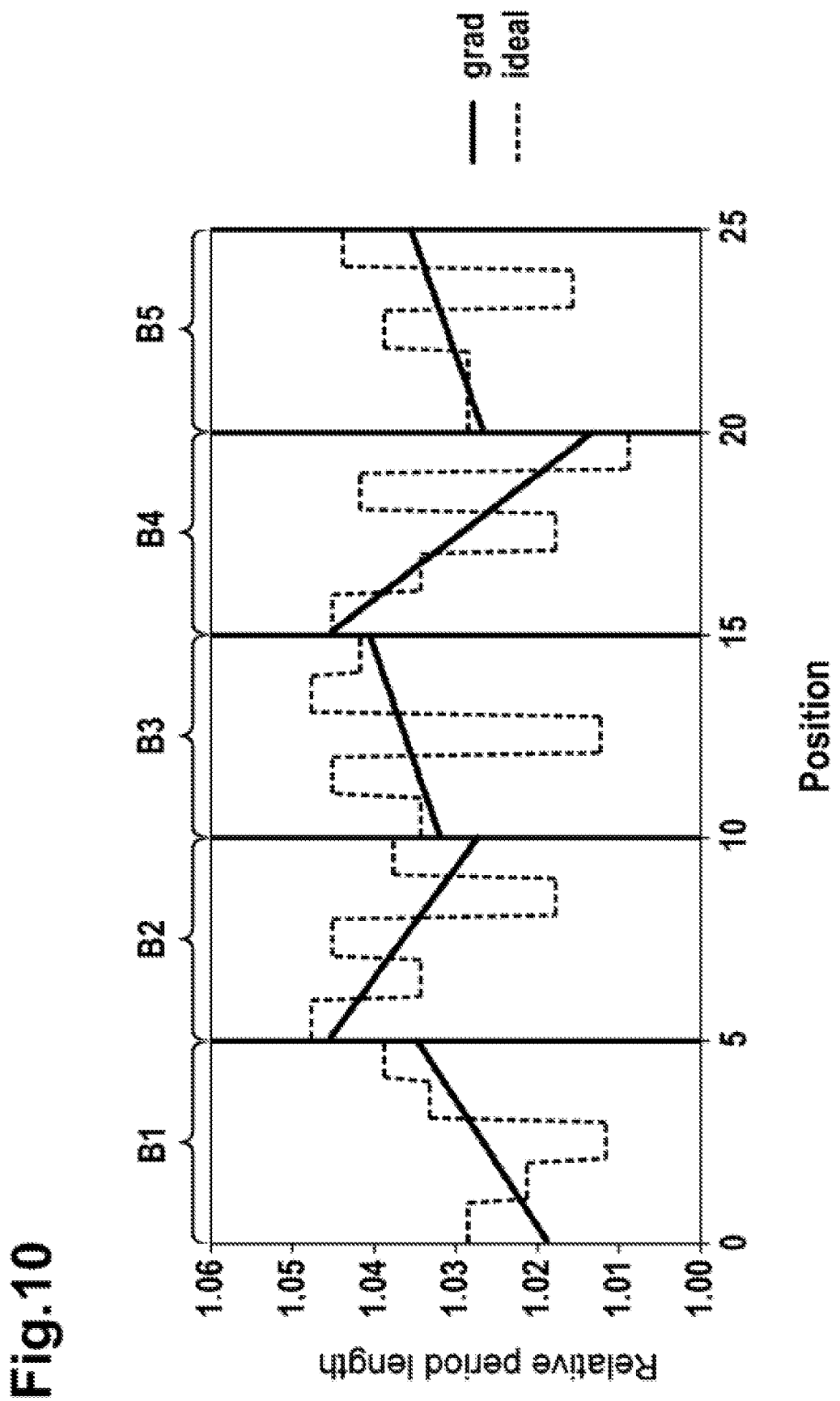
FIG. 10 shows the reflective coating of a second embodiment of a reflective optical element according to the invention with five main units.

In a further embodiment illustrated schematically in FIG. 10, the reflective coatings of the main units B1 to B5 in the reflective optical element are implemented as multilayer systems, the layer thicknesses of which correspond to a first-degree polynomial. To produce this embodiment, each main unit is divided into surface units, and for each main unit the angles of incidence occurring during operation over all the surface units thereof are determined. Next, ascertained in dependence on the desired angles of incidence is a desired period length of a multilayer system, which approximates the variation of the desired period length over the surface units for each main unit by a first-degree polynomial. Subsequently, the corresponding multilayer system is applied to each main unit as a reflective coating.

In the example illustrated here in FIG. 10, again each main unit B1 to B5 is divided into in each case five surface units, specifically as in the other exemplary embodiments explained here, in a manner such that each surface unit belongs to a different field facet and combines sub-units, for example individual micro-mirrors, having similar angles of incidence and angle of incidence bandwidths. They are designated with a position from 1 to 25. The resulting period length for each main unit B1 to B5, which is approximated by a straight line, is shown in FIG. 10 as a thick solid line, which is designated with "grad."

Figure 11:
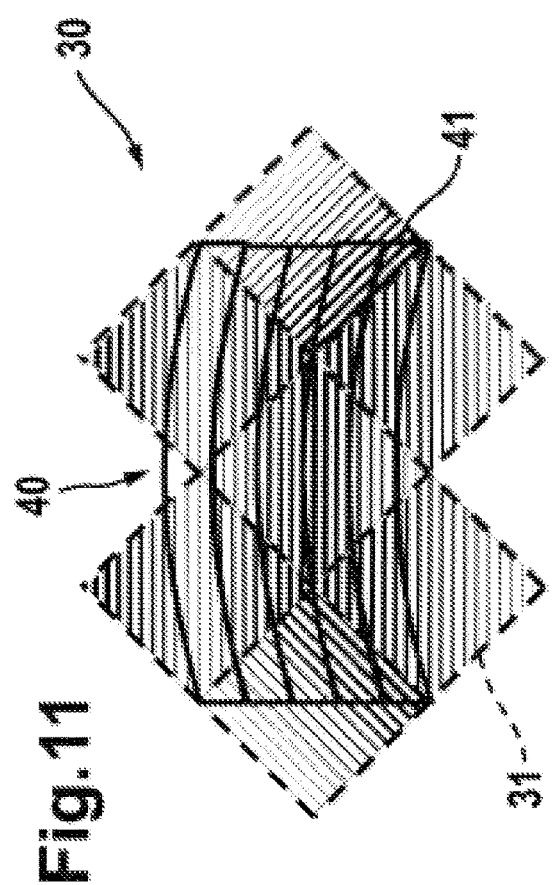
FIGS. 11, 12 show two further schematic views of the reflective optical element from FIG. 3.
Figure 12:
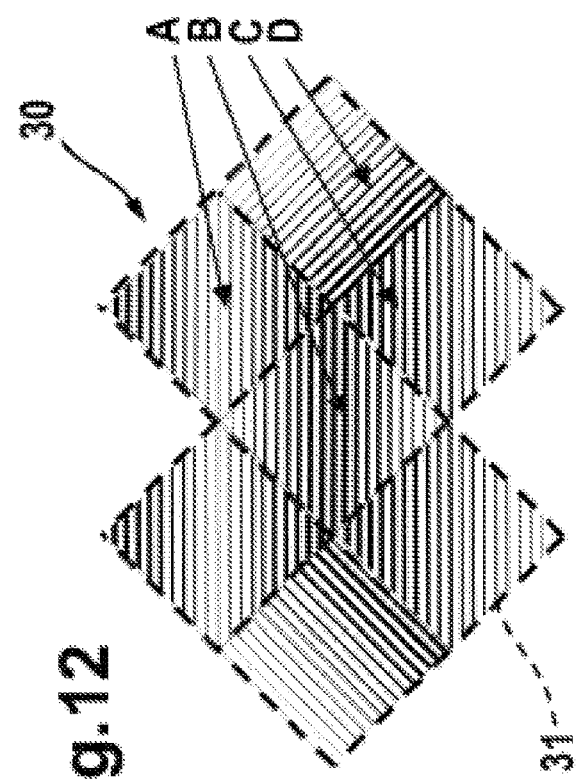
Figure 13:
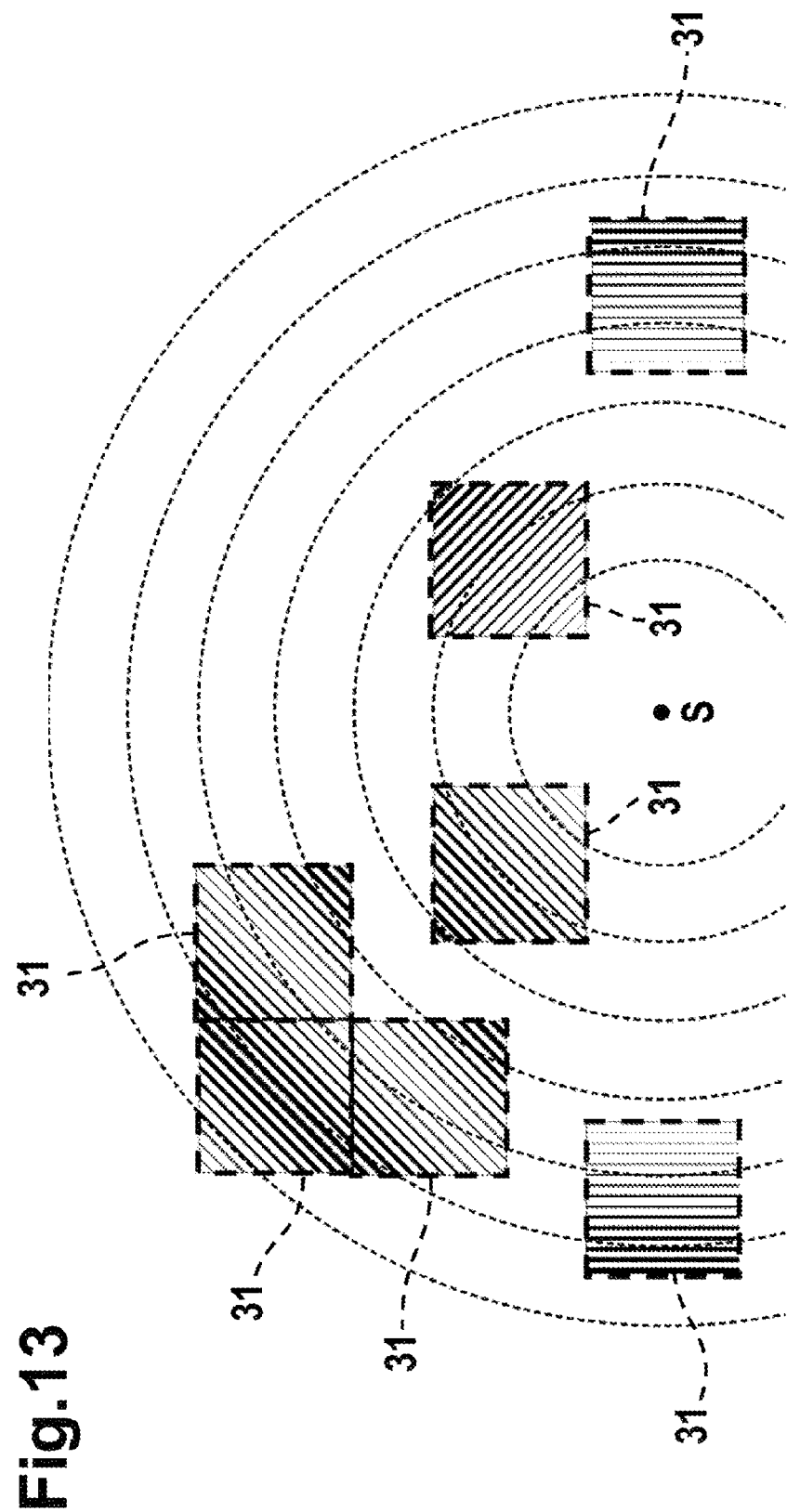
FIG. 13 shows one possible arrangement of main units to be coated in a coating machine.

The approximation of the variation of the average angle of incidence by linear gradients in as few directions as possible permits the coating of all main units in one batch. To this end, a layer thickness profile is set during the coating, which oscillates with a short spatial wavelength via the coating holder. FIG. 11 schematically supplements the illustration from FIG. 3 by the variation of the period length, which is indicated by hatching. FIG. 12 omits the field facets so as to better show the hatching. Thicker lines indicate a higher period length than thinner lines. Required in region A is a linear gradient from maximum to minimum to maximum period length over the diagonal of the main unit, required in region B, likewise over the diagonal, is a linear gradient from minimum to maximum to minimum period length, required in region C, likewise over the diagonal, is a linear gradient from maximum to minimum period length, and required in region D, in the longitudinal direction, is a linear gradient from minimum to maximum period length. In a coating machine, in which layer thicknesses can be applied in a radial-geometrically oscillating fashion, the main units to be coated can be arranged accordingly on the coating holder, depending on the desired gradient for the period length, as is schematically illustrated in FIG. 13, wherein the circles which are concentric around the spin axis S of the coating holder are dashed lines of constant layer thickness.

Figure 14:
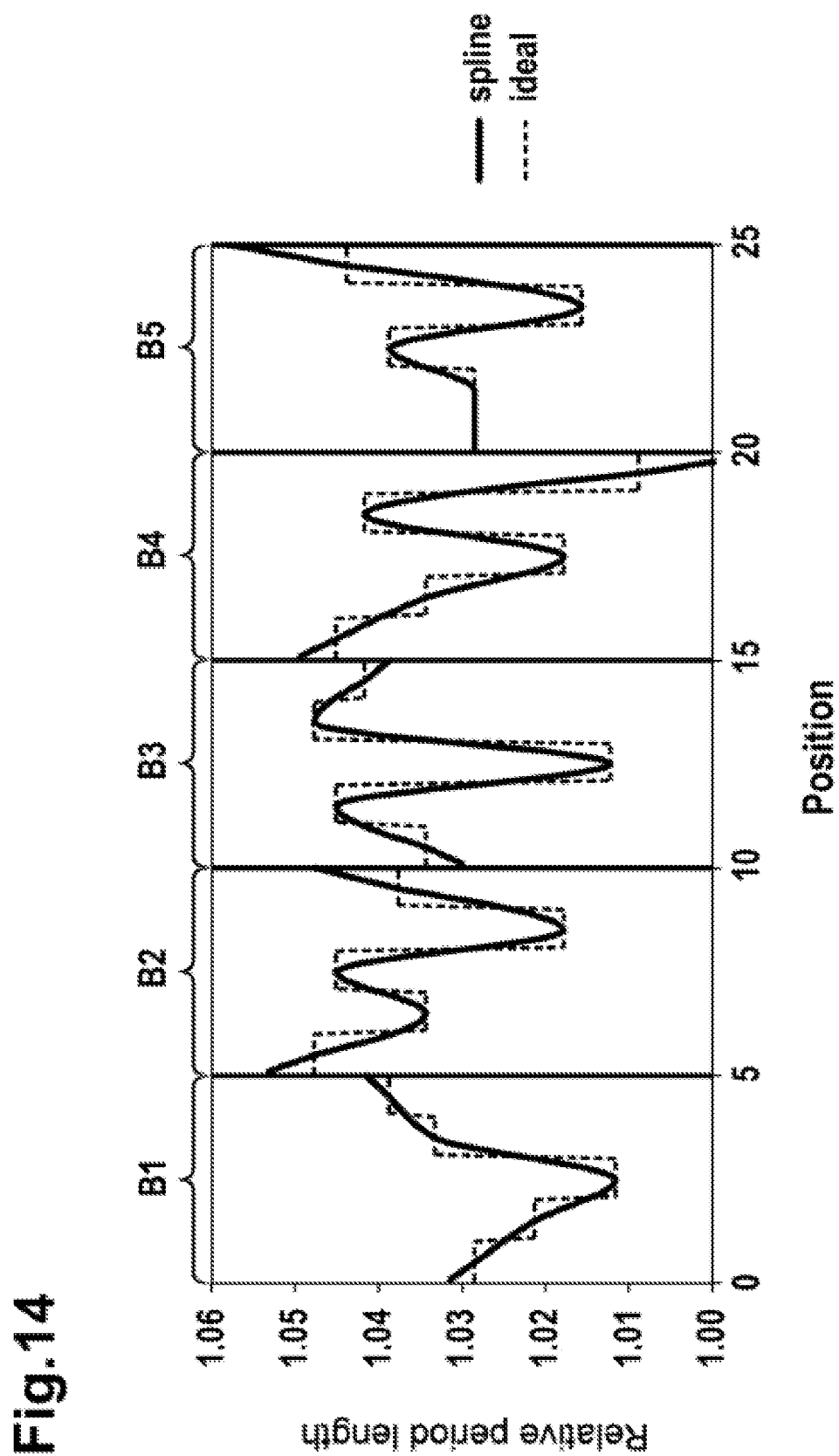
FIG. 14 shows the reflective coating of a third embodiment of a reflective optical element according to the invention with five main units.

In the example shown in FIG. 14, each main unit B1 to B5 was divided as for previous examples. However, the variation of the ideal desired period length over the surface units for each main unit was approximated by a polynomial of a higher degree. The resulting relative period length of the basic multilayer system for each main unit B1 to B5 is shown in FIG. 13 as a thick solid line, which is designated with "spline."

This approximation of the variation of the average angles of incidence for each main unit is preferably performed not only in a direction longitudinally with respect to a linear gradient, but two-dimensionally over the entire surface of the respective main unit. A corresponding reflective coating with two-dimensional local thickness variations can be produced, for example, using honeycomb masks. For more complex thickness distributions, a temporally controllable method without a mask can be used, as disclosed for example in DE 10 2012 205 615 A1.

Figure 15:
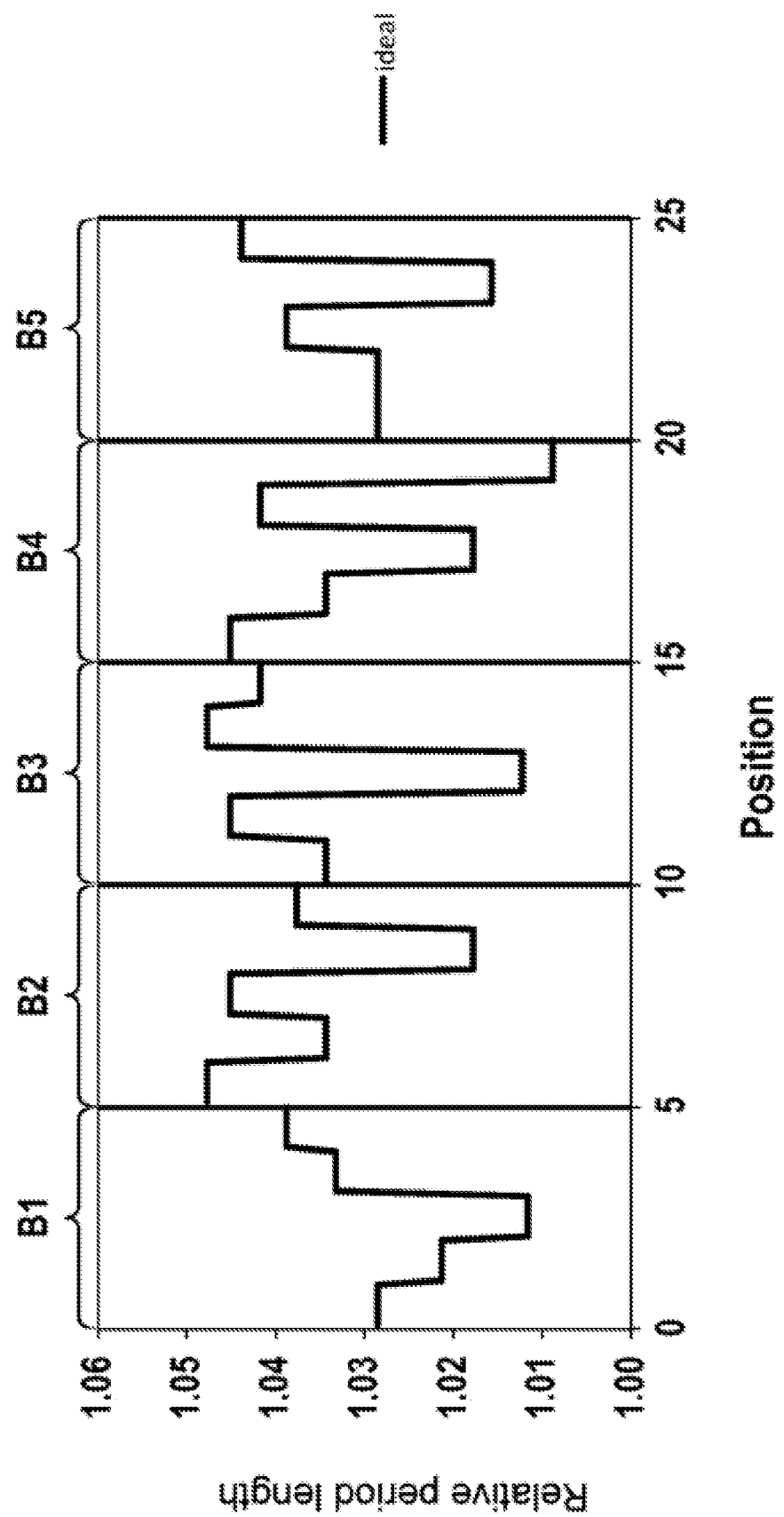
FIG. 15 shows the reflective coating of a fourth embodiment of a reflective optical element according to the invention with five main units.

The more coefficients of a higher degree are taken into account, the better can be the approximation of the profile of the ideal desired period length. FIG. 15 schematically illustrates an example of a profile of the period length, which coincides with the profile of the ideal desired period length. This profile is drawn as a thick solid line and designated with "ideal." Such a reflective coating can be produced easily in particular if the sub-units of each main unit are individually actuable micro-mirrors, such as in the context of microelectromechanical systems. Since the applied coating thickness also depends on the orientation of the surface to be coated with respect to the particle source, each micro-mirror can be tilted for the coating such that the actually deposited thickness corresponds to the desired thickness. In particular, the unevennesses in the ideal desired period length over the surface of the main unit can be approximated thereby.

Figure 16:
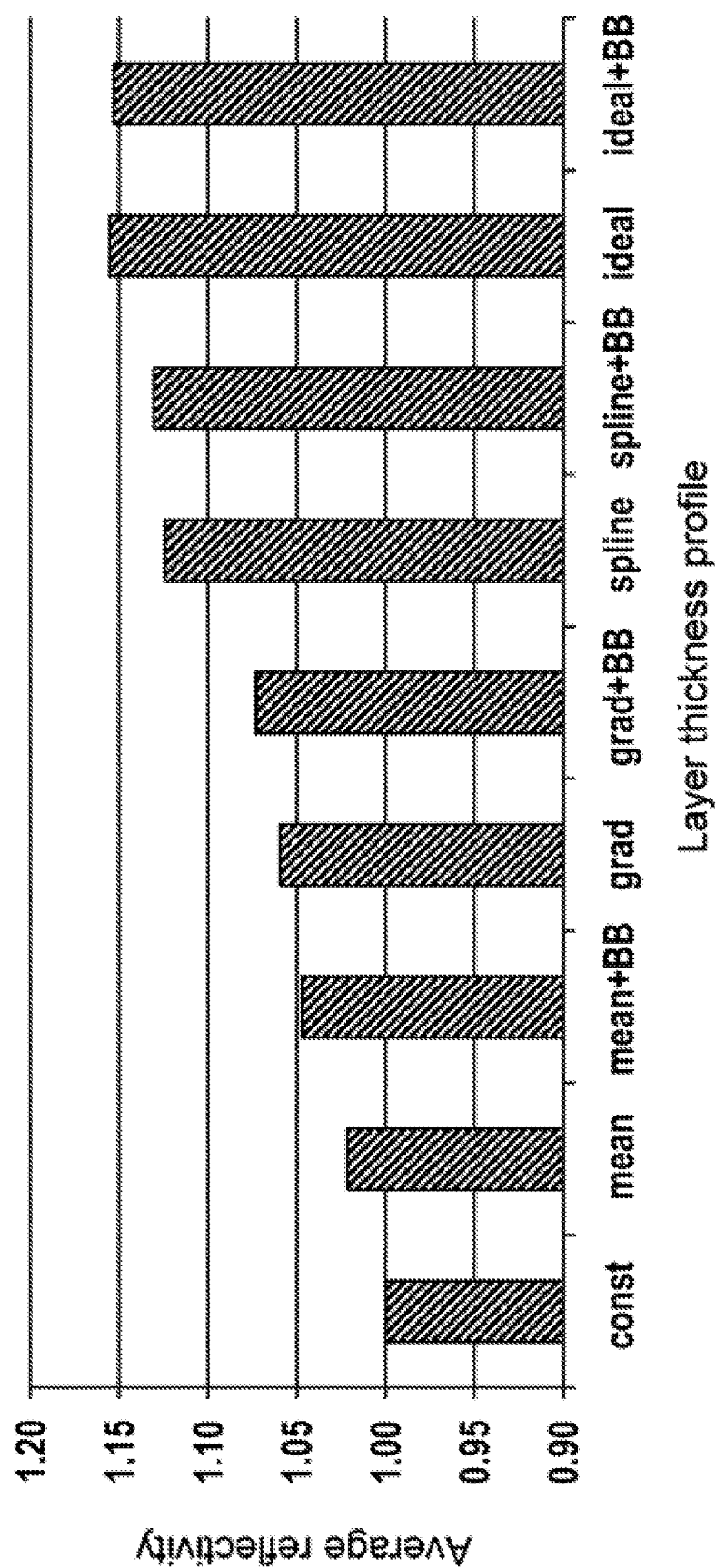
FIG. 16 shows the average reflectivity for average angles of incidence for the optical reflective elements from FIGS. 10 to 14.

The effect of the procedure proposed here will be illustrated on the basis of the following FIGS. 16 to 19. FIG. 16 shows the average reflectivity for the entire field facet mirror calculated for the exemplary embodiments introduced here in accordance with FIGS. 8 ("mean"), 10 ("grad"), 14 ("spline") and 15 ("ideal"). The reflectivity is here normalized to the value of the conventional reflective optical element in accordance with FIG. 7. Adapting the reflective coating to the average angle of incidence over each entire main unit can already produce a significant reflectivity gain, the average reflectivity can be increased by more than 5% with the linear approximation, by approximately 12.5% with the quadratic approximation, and even by more than 15% by way of adaptation to the average angle of incidence of each field facet.

Furthermore examined were also examples in which the main units have additionally been divided into two broadbandedness classes and the main units B1 and B5 were provided with the basic multilayer system "standard" explained in connection with FIG. 9 and the main units B2 to B4 were provided with the basic multilayer system "broadband." The corresponding values in FIG. 16 have the addition "+BB." In particular in the embodiments "mean" and "grad" it is possible by taking account of the angle of incidence bandwidths to achieve an additional increase in the total reflectivity by a few percent.

Figure 17:
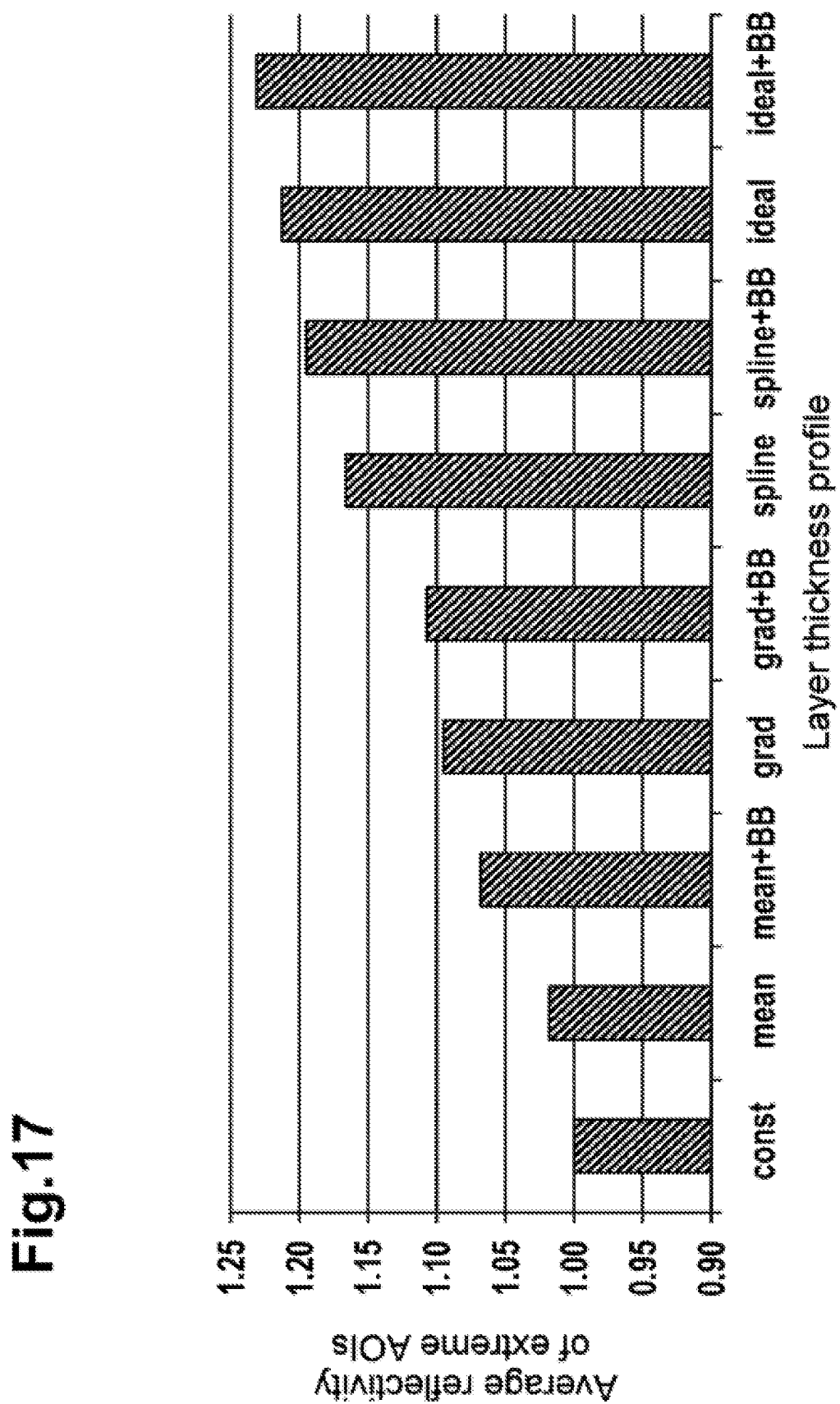
FIG. 17 shows the average reflectivity for extreme angles of incidence for the optical reflective elements from FIGS. 10 to 14.
Figure 18:
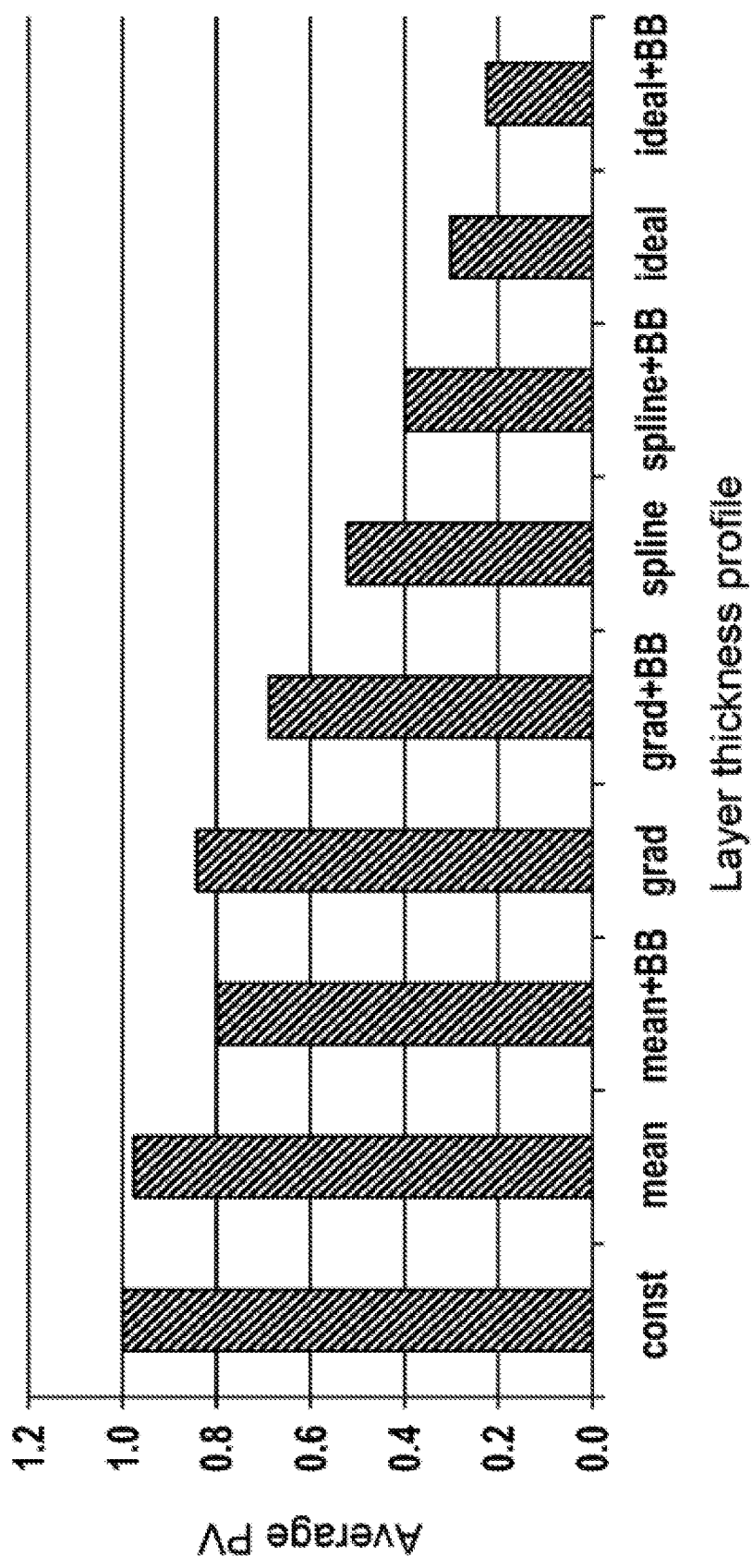
FIG. 18 shows the average PV value for average angles of incidence for the optical reflective elements from FIGS. 10 to 14.
Figure 19:
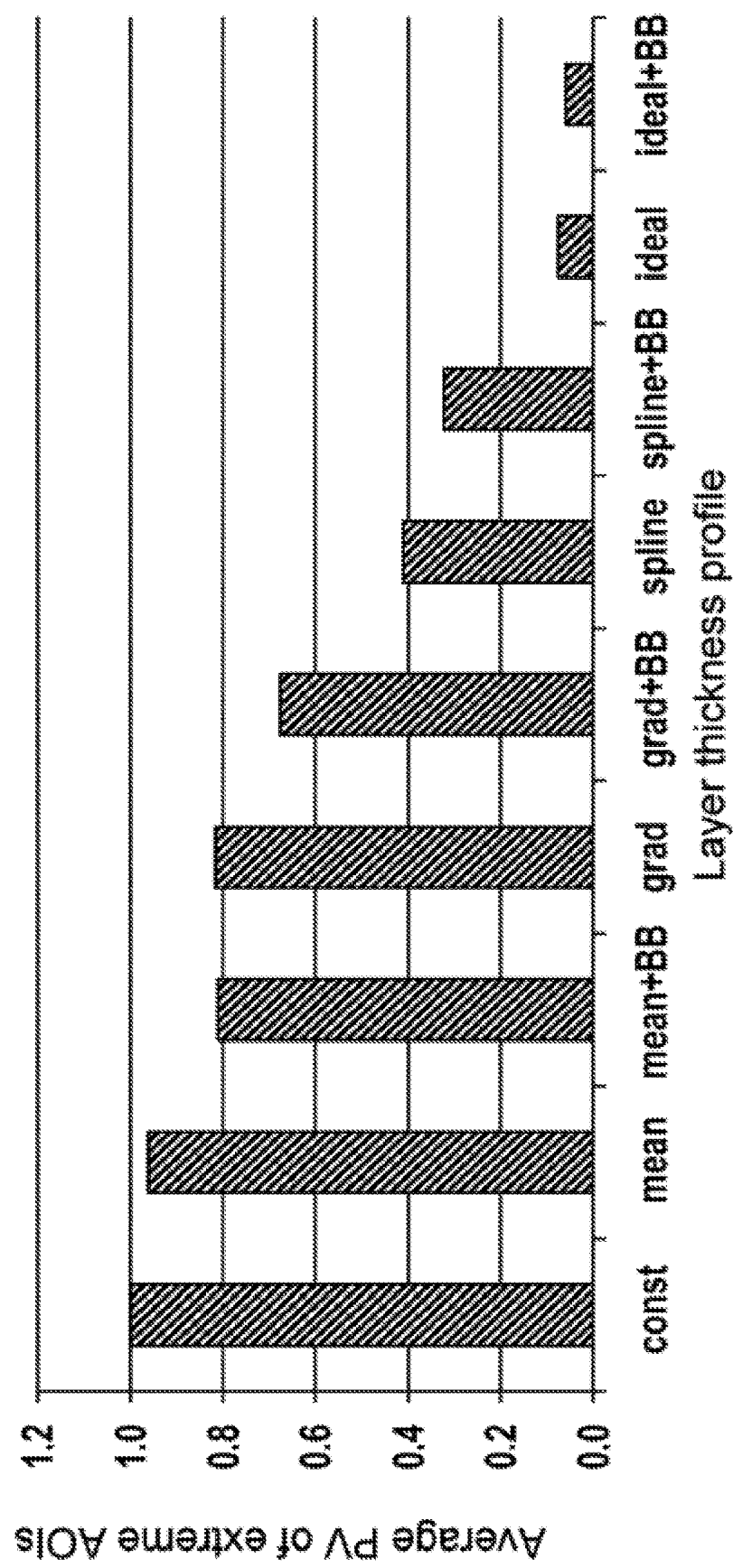
FIG. 19 shows the average PV value for extreme angles of incidence for the optical reflective elements from FIGS. 10 to 14.

These increases in reflectivity can be established to an even greater extent for the average reflectivity in the extreme angles of incidence, that is to say the minimum and maximum angles of incidence (see FIG. 17).

Also considered were the average peak-to-valley values for the average angle of incidence (FIG. 18) and the extreme angles of incidence (FIG. 19), which are a measure of the deviation of the actual coating from the ideal reflective coating, which is optimized at each surface point to the angles of incidence, which are respectively incident there. The peak-to-valley values are again normalized to the value for the example 7 according to the prior art. The procedure explained here can be used to approximate the ideal coating well in particular for the extreme angles of incidence.

What is claimed is:

1. A method for producing a reflective optical element, which is composed of at least two main units, for the extreme ultraviolet wavelength range, wherein each main unit has a multiplicity of sub-units, comprising:
   determining operational angles of incidence and angle of incidence bandwidths occurring over respective surfaces of each main unit;
   applying a respective reflective coating on each main unit, wherein each of the respective coatings is adapted to the operational angles of incidence and angle of incidence bandwidths which are respectively determined over the respective surfaces;
   determining respective maximum bandwidths of the angles of incidence for each main unit; and
   applying a respective multilayer system, having a layer sequence and/or layer thicknesses that is/are adapted to the overall largest determined maximum bandwidth, onto each main unit as a reflective coating.

2. A method for producing a reflective optical element, which is composed of at least two main units, for the extreme ultraviolet wavelength range, wherein each main unit has a multiplicity of sub-units, comprising:
   determining operational angles of incidence and angle of incidence bandwidths occurring over respective surfaces of each main unit;
   applying a respective reflective coating on each main unit, wherein each of the respective coatings is adapted to the operational angles of incidence and angle of incidence bandwidths which are respectively determined over the respective surfaces;
   determining maximum bandwidths of the angles of incidence for each main unit, and then dividing the main units into bandwidth classes; and
   applying a respective multilayer system, having a layer sequence and/or layer thicknesses that is/are adapted to the maximum bandwidth that is determined for a respective bandwidth class, onto each main unit as a reflective coating.

3. A method for producing a reflective optical element, which is composed of at least two main units, for the extreme ultraviolet wavelength range, wherein each main unit has a multiplicity of sub-units, comprising:
   determining operational angles of incidence and angle of incidence bandwidths occurring over respective surfaces of each main unit;
   applying a respective reflective coating on each main unit, wherein each of the respective coatings is adapted to the operational angles of incidence and angle of incidence bandwidths which are respectively determined over the respective surfaces;
   dividing each main unit into surface units;
   determining, for each main unit, the angles of incidence occurring during operation over all the surface units;
   ascertaining a desired period length of a multilayer system in dependence on the desired angles of incidence;
   approximating variations in the desired period length over the surface units for each main unit by an nth-degree polynomial, with n being a non-negative integer; and
   applying the corresponding multilayer system to each main unit as a reflective coating.

4. The method as claimed in claim 3, wherein the surface units correspond to the sub-units.

5. A method for producing a reflective optical element, which is composed of at least two main units, for the extreme ultraviolet wavelength range, wherein each main unit has a multiplicity of sub-units, comprising:
   determining operational angles of incidence and angle of incidence bandwidths occurring over respective surfaces of each main unit;
   applying a respective reflective coating on each main unit, wherein each of the respective coatings is adapted to the operational angles of incidence and angle of incidence bandwidths which are respectively determined over the respective surfaces;
       wherein applying respective reflective coatings onto the main units is by locating the main units on a coating holder, which rotates about an axis, and
       wherein regions of constant layer thicknesses are arranged concentrically around the axis.

6. A reflective optical element for the extreme ultraviolet wavelength range, composed of at least two main units, wherein each main unit has a multiplicity of sub-units, wherein each main unit has a respective reflective coating that is adapted to operational angles of incidence and angle of incidence bandwidths occurring over respective surfaces of each main unit, wherein at least one of the respective coatings is adapted for two or more operational angles of incidence and two or more angle of incidence bandwidths, and wherein at least one of said two or more angle of incidence bandwidths is larger than 2°, and wherein the respective reflective coating of said each main unit is adapted to a largest maximum bandwidth obtained based on determined respective maximum bandwidths of the angles of incidence for said each main unit.

7. The reflective optical element as claimed in claim 6, wherein the reflective coatings are embodied as multilayer systems, having layer thicknesses and/or a layer sequence which is/are adapted to the angles of incidence and angle of incidence bandwidths respectively occurring over the surface of the main unit during operation.

8. The reflective optical element as claimed in claim 6, wherein the reflective coatings are embodied as multilayer systems, the layer thicknesses of which vary with a function that corresponds in each case to an nth-degree polynomial, with n corresponding to a non-negative integer.

9. The reflective optical element as claimed in claim 6, wherein each sub-unit is embodied as an individually actuable mirror.

10. The reflective optical element as claimed in claim 6, embodied as a field facet mirror.

11. An optical system, having a reflective optical element as claimed in claim 6.

12. The optical system as claimed in claim 11, configured for extreme ultraviolet lithography.

13. An EUV lithography apparatus having a reflective optical element as claimed in claim 6.

14. A reflective optical element for the extreme ultraviolet wavelength range, composed of at least two main units, wherein each main unit has a multiplicity of sub-units, wherein each main unit has a respective reflective coating that is adapted to operational angles of incidence and angle of incidence bandwidths occurring over respective surfaces of each main unit, wherein at least one of the respective coatings is adapted for two or more operational angles of incidence and two or more angle of incidence bandwidths, wherein at least one of said two or more angle of incidence bandwidths is larger than 2°, and wherein the respective reflective coating of said each main unit is adapted to a respective bandwidth class, wherein the at least two main units are divided into at least two bandwidth classes based on determined maximum bandwidths of the angles of incidence for said each main unit.

* * * * *

UNITED STATES PATENT AND TRADEMARK OFFICE
CERTIFICATE OF CORRECTION

PATENT NO. : 11,073,765 B2
APPLICATION NO. : 16/053130
DATED : July 27, 2021
INVENTOR(S) : Enkisch Page 1 of 1

It is certified that error appears in the above-identified patent and that said Letters Patent is hereby corrected as shown below:

In the Specification

Column 4, Line 58, delete "system," and insert -- system; --, therefor.

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*